(12) United States Patent
Johnson

(10) Patent No.: US 8,977,809 B2
(45) Date of Patent: Mar. 10, 2015

(54) SHARING RESOURCES IN MULTI-DICE STACKS

(75) Inventor: James Brian Johnson, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 609 days.

(21) Appl. No.: 12/323,717

(22) Filed: Nov. 26, 2008

(65) Prior Publication Data

US 2010/0131684 A1 May 27, 2010

(51) Int. Cl.
| | |
|---|---|
| *G11C 7/00* | (2006.01) |
| *H01L 25/065* | (2006.01) |
| *G11C 7/10* | (2006.01) |
| *G11C 5/02* | (2006.01) |
| *G11C 5/04* | (2006.01) |
| *G11C 7/20* | (2006.01) |
| *H01L 25/00* | (2006.01) |
| *H01L 23/00* | (2006.01) |
| *H01L 25/18* | (2006.01) |

(52) U.S. Cl.
CPC .......... *H01L 25/0657* (2013.01); *G11C 7/1072* (2013.01); *G11C 5/02* (2013.01); *G11C 5/04* (2013.01); *G11C 7/20* (2013.01); *H01L 25/50* (2013.01); *H01L 24/13* (2013.01); *H01L 25/18* (2013.01); *H01L 2223/54433* (2013.01); *H01L 2223/5444* (2013.01); *H01L 2224/0557* (2013.01); *H01L 2224/13025* (2013.01); *H01L 2224/16* (2013.01); *H01L 2225/06513* (2013.01); *H01L 2225/06527* (2013.01); *H01L 2225/06541* (2013.01)
USPC ........................................................ 711/105

(58) Field of Classification Search
None
See application file for complete search history.

(56) References Cited

U.S. PATENT DOCUMENTS

| | | | | |
|---|---|---|---|---|
| 6,678,814 | B2 * | 1/2004 | Arimilli et al. | 711/173 |
| 6,801,984 | B2 * | 10/2004 | Arimilli et al. | 711/146 |
| 6,976,131 | B2 * | 12/2005 | Pentkovski et al. | 711/146 |
| 7,111,149 | B2 * | 9/2006 | Eilert | 711/220 |
| 2009/0249014 | A1 * | 10/2009 | Obereiner et al. | 711/164 |

* cited by examiner

*Primary Examiner* — Aimee Li
*Assistant Examiner* — Craig Goldschmidt
(74) *Attorney, Agent, or Firm* — Schwegman Lundberg & Woessner, P.A.

(57) ABSTRACT

Apparatus, systems, and methods for configuring a plurality of stacked semiconductor dice with unique identifiers and identifying a die in the stack using the unique identifier are provided. Additional apparatus and methods are disclosed.

21 Claims, 8 Drawing Sheets

SHARING RESOURCES IN MULTI-DICE STACKS

BACKGROUND

As the focus in microelectronics is gradually changing to include more emphasis on packaging, added value may be attained in packages by using System-in-Packages (SiP) methods. SiP methods may be considered as a leading viable solution for the ongoing trend in function integration. SiP methods include placing several dice into one package, either side-by-side or on top of each other.

BRIEF DESCRIPTION OF THE DRAWINGS

Some embodiments of the disclosed technology are illustrated by way of example and not limitation in the figures of the accompanying drawings in which.

DETAILED DESCRIPTION

Figure 1:
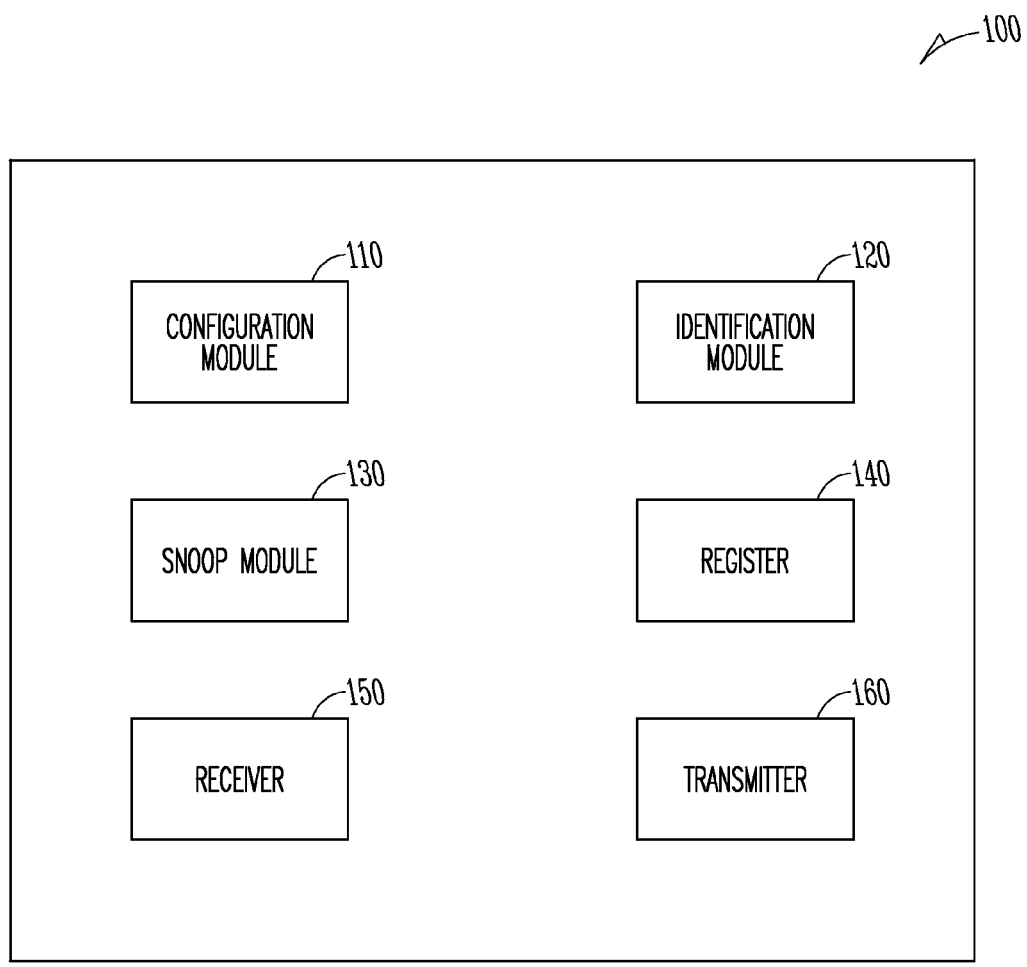
FIG. 1 is a block diagram illustrating an example of modules of a circuit for sharing resources in a multi-dice stack, according to various embodiments of the invention.

Example methods and circuits for sharing resources in multi-dice stacks will be described. In the following description for purposes of explanation, numerous examples having example-specific details are set forth to provide an understanding of example embodiments. It will be evident, however, to one skilled in the art that the present examples may be practiced without these example-specific details.

Some example embodiments described herein may include configuring a die of a number of stacked semiconductor dice (e.g., dice of a multi-dice stack, such as a 3-dimensional (3-D) die stack) and using a unique identifier to identify the die. Unique identifiers may include, but are not limited to, unique identification numbers such as 0, 1, 2, etc. The configuration may include enumeration of the dice of the multi-dice stack using the unique identification numbers. The unique identifier may be used to identify a specific die among the dice of the multi-dice stack, for example, when a command is directed to the specific die.

Example methods may include making ownership of (e.g., a right to control such as to receive or to generate) a signal by an identified die observable to other dice of the plurality of the multi-dice stack. For example, when a signal is generated by a device on a particular die, allowing other dies to know that the signal is generated by that particular die. The signal may include one or more commands, addresses, or data. According to described example methods, resources including one or more buses (e.g., a control bus, an address bus, or data bus) may be shared between dice of the multi-dice stack.

The use of enumeration of the dice of the multi-dice stack may be useful when, for example, more than one device in the multi-dice stack may use a clocking function. Due to timing constraints, each device may require its own dedicated clock signal. Traditionally, interconnected devices such as dynamic random access memories (DRAM) having a common command, address or data bus, in a planar configuration, may use a chip select signal to identify a chip. However, in a multi-dice stack, providing unique interconnects such as vias (e.g., through-silicon vias (TSV)) for individual DRAMs may become prohibitively expensive. For example, when the multi-dice stack comprises of 8 DRAMS, each including multiple logically-independent partitions (see, FIG. 6), employing individual TSVs for each partition may result in use of 128 (8×16) TSVs.

The number of TSVs used to interconnect the devices in the dice of a stack may be reduced by assigning a unique identifier to each DRAM. Different partitions in a DRAM may share the same unique identifier. For example, in an 8-DRAM stack, since 3 bits would be sufficient to identify 8 DRAMS, 3 TSVs may be used for each partition. Therefore, for a 16 partition die, a total number of 16×3=48 TSVs may be used, which is a major reduction compared to the 128 TSVs used if enumeration of DRAMs was not employed (see end of paragraph 13). The unique identifier for each DRAM may be stored in a register on the DRAM. The DRAM may respond to a command received by the DRAM, only when an identification transmitted along with the command matches the stored unique identifier.

FIG. 1 is a block diagram illustrating an example of a circuit 100 for sharing resources in a multi-dice stack, according to various embodiments. The circuit 100 may include a configuration module 110, an identification module 120, a snoop module 130, a register 140, a receiver 150, and a transmitter 160. All or parts of the components shown in FIG. 1 may be provided on each die of the dice of the multiple-dice stack. According to example embodiments, the configuration module 110 may configure a die of a number of stacked semiconductor dice using a unique identifier. The configuration may include, but not be limited to, enumeration of the dice of the multi-dice stack using identification numbers as unique identifiers. For example, in a four dice stack, the numbers may include zero, one, two, and three to identify the dice in the stack from the lowest die in the stack to the top die of the stack, respectively.

According to example embodiments, the configuration module 110 may be arranged to configure the dice (e.g., DRAMs) of the multi-dice stack upon a power-up or reset of the multi-dice stack. The configuration module 110 may use an adjacent die to enable configuration of a specific die. The adjacent die, for example, may be a die sitting under the specific die in the multi-dice stack, as described in detail below in the discussion of FIG. 3.

During normal operation, the identification module 120 may identify the die using the unique identifier. The identification module 120 may be arranged to compare a received identification number with a stored unique identifier to identify the die. For example, whenever the die detects a signal on a bus, the identification module 120 may compare an identification number transmitted in conjunction with the signal, with an identification number assigned to the die (e.g., the stored unique identifier stored in the register 140). One or more of the devices on the die may take the ownership of the signal, for example, by responding to the signal when the identification module 120 confirms that the identification number matches an identification number assigned to the die. The bus may be used to share signals by the dice of the multi-dice stack. The signal may include data, a command, or an address that may be communicated over a data bus, a control bus (e.g., control bus 360 of FIG. 3), or an address bus (e.g., buses 370 of FIG. 3), respectively.

In an example embodiment, the identification module 120 may include an input/output (I/O) interface. The identification module 120 may identify the die by applying an identification number to inputs at the I/O interface. Once the identification number is applied to the inputs of the I/O interface, the I/O interface may identify the die by comparing the identification number with a unique identifier stored on the register 140 provided on the die. In an alternative example embodiment, the identification module 120 may include a decoder to decode a received identification number to generate a set of select signals. The set of select signals may cause selection of the die as described in more detail below.

The snoop module 130 may be local to each die of the multi-dice stack and observe signals transmitted to other dice of the multi-dice stack. The signal may include control or timing (clock) signals. By observing control and clock signal transmitted to other dice of the multi-dice stack, the snoop module 130 may control access to shared resources, such as one or more data buses, so as to avoid data contention with other dice of the multi-dice stack. Each die of the multi-dice stack may include the receiver 150 to receive signals from one or more buses. Each die may also include the transmitter 160 to transmit signals to the bus when enabled to drive the bus, as discussed below.

Figure 2:
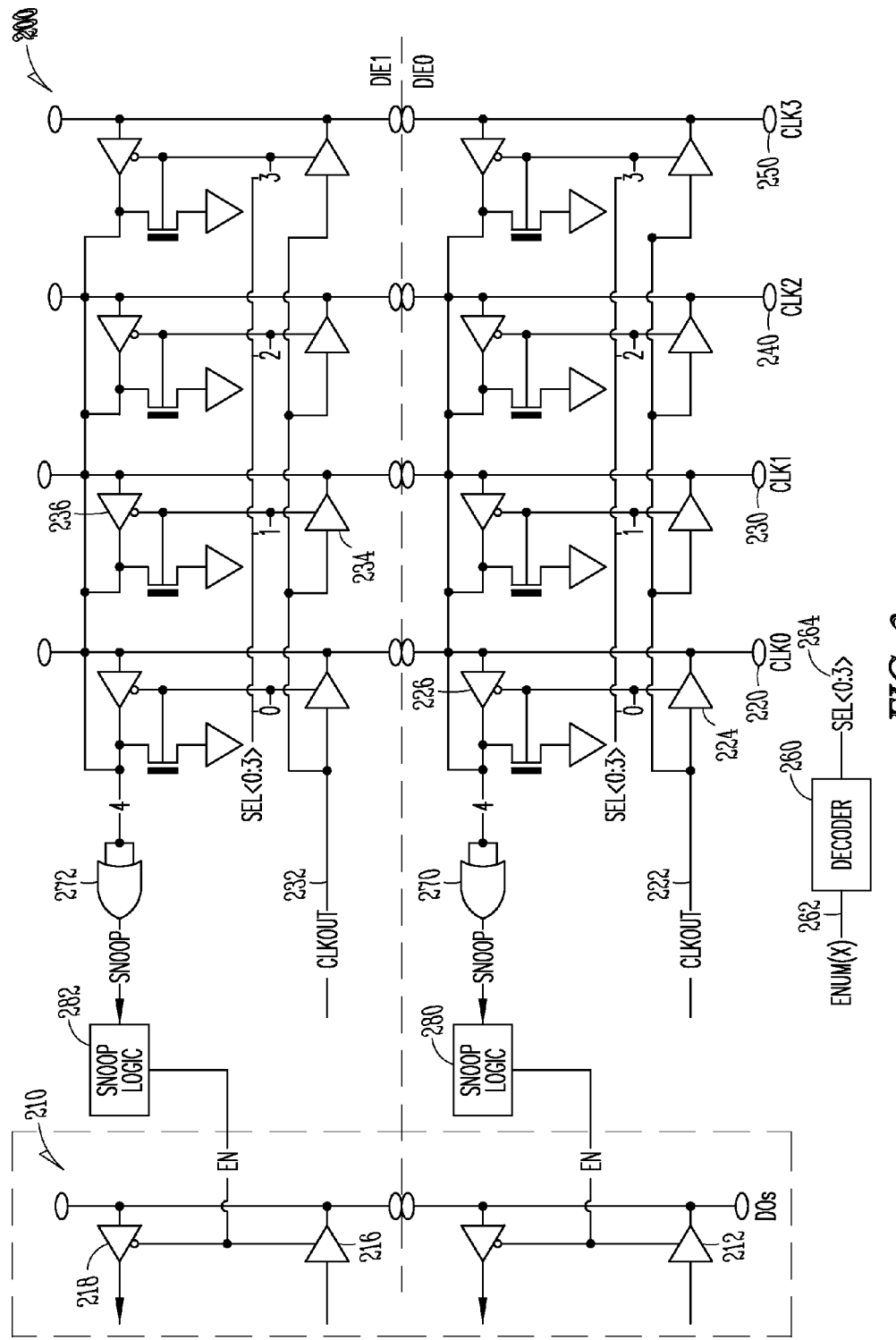
FIG. 2 is a diagram illustrating an example of circuits for sharing resources in a four-dice stack, according to various embodiments of the invention.

FIG. 2 is a diagram illustrating an example of circuit 200 for sharing resources in a four dice stack, according to various embodiments. The circuits are only shown for two dice of a four-dice stack identified by unique identifiers 0 and 1 as die0 and die1. The four-dice stack may include four control signals 220, 230, 240 and 250, which are used to indicate access to the shared resources such as a data bus 210 (DQ0). The control data may include clock signals or strobe signals. For each die on the multi-dice stack, there may be one set of control signals. The dice on the four-dice stack may be identified by unique identifiers, such as 0 to 3. Every time the four dice stack is powered up or reset, the enumeration logic 312 shown in FIG. 3 may assign one set of the control signals 220, 230, 240, and 250 to one of the dice of the four-dice stack. The number of control signals may be the same as the number of dice in a multi-dice stack and is not limited to four.

The assignment of the one set of control signals to each of the dice of the multi-dice stack may be valid for a particular period of time, during which the die may generate one or more control signals. For example, when the die is a DRAM that has received a read request, the DRAM may send a clock pulse to signal that the DRAM is about to drive a data bus 210.

Figure 3:
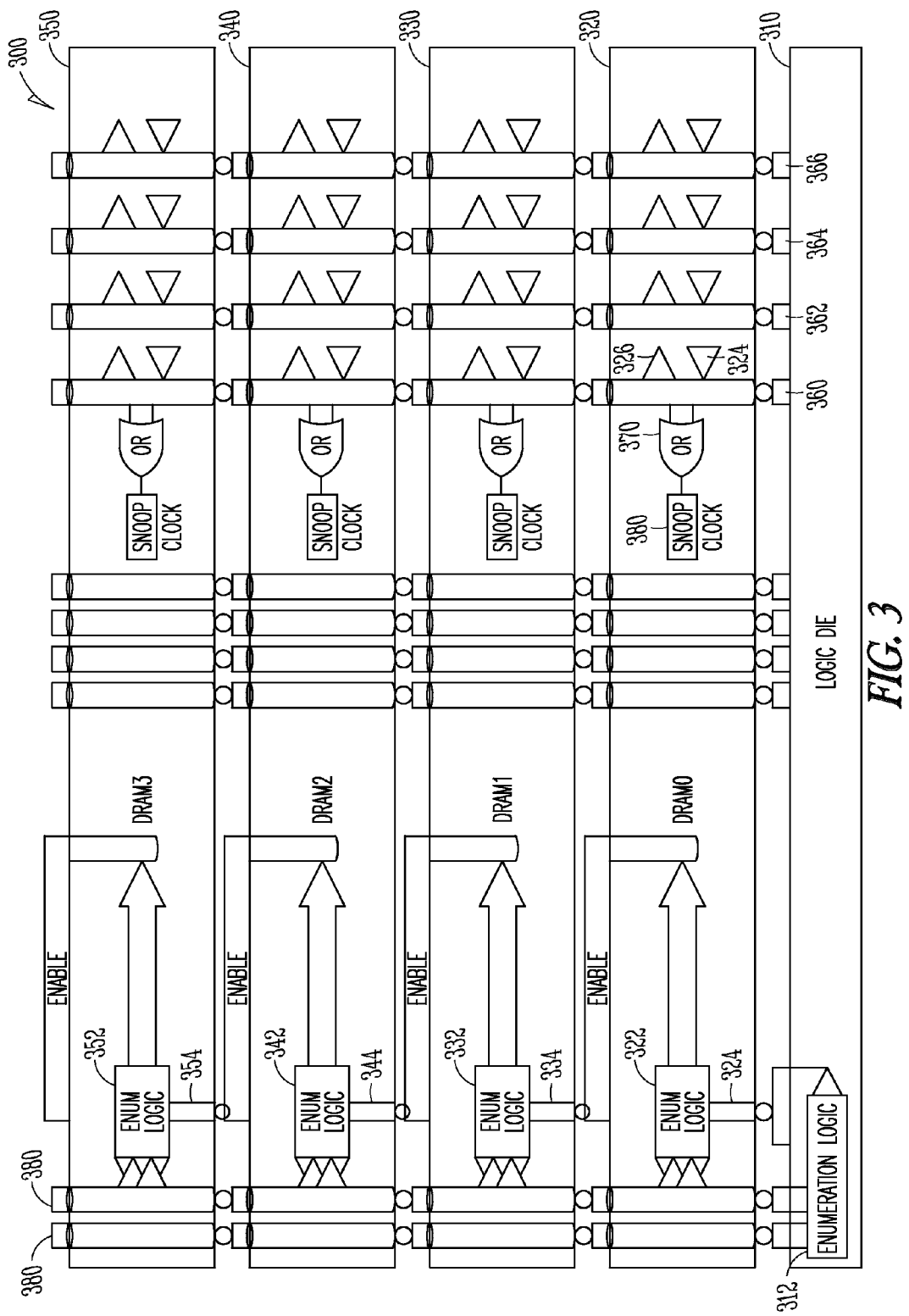
FIG. 3 is a diagram illustrating an example of a multi-dice stack and associated resource sharing circuits, according to various embodiments of the invention.

As shown in FIG. 2, the decoder 260 may decode an identification (ID) number 262 generated by the enumeration logic 312 of FIG. 3 to generate a set of select signals 264. The set of select signals 264 may cause the selection of one of the dice of the four-dice stack. For example, to assign the control signal 220 to the die0, the set of select signals 264 generated by the decoder 260 may cause a switch 228 to close and therefore enable die 0 to have ownership of the control signal 220. The set of select signals 264 are applicable to select lines of other dice (such as, select line 239) as well. For example, when the set of select signals 264 generated by the decoder 260 cause the switch 238 to close, the die1 is enabled to claim the ownership of control signal 230.

In the example embodiment shown in FIG. 2, each die of the four dice stack may comprise a DRAM (e.g., a DRAM0 and a DRAM1) and the control signals 220, 230, 240, and 250 may be transmitted through TSVs. When the DRAM0 is assigned the control signal 220 (also shown as CLK0), the DRAM0 may transmit a control signal 220 to let a logic die 310 shown in FIG. 3 know that the DRAM0 is reading out data. A high (e.g., logic level 1) select signal on a select line 229 may enable the driver 224 of the DRAM0 to generate the control signal 220 using the clock signal (e.g., CLKOUT) 222. The same high select signal may disable a receiver 226 of DRAM0. While the DRAM0 is reading out, the receivers of the other DRAMs connected to the control signal 220, are not connected to select lines (such as select line 239) thus are not disabled and may monitor the control signal 220.

When the receiver 226 is disabled by a high signal on the select line 229, a transistor 227 having a high signal on its gate (connected to select line 229 when the switch 228 is closed) is turned ON. The ON transistor 227 may pull an output of the receiver 226, which is disabled, to the ground. As a result, an input of an OR-gate 270, connected to the output of receiver 226, will also be connected to the ground. The OR-gate 270 may then pass signal transitions from the other control signals routed from the other dice of the multi-dice stack to other inputs of the OR-gate 270 to the snoop logic 280. The snoop logic 280 may respond to the signal transitions from other control signals by enabling a diver 212 to drive the data bus 210. The enabling of the diver 212 may occur, at an appropriate time based on access status of the other dice of the multi-dice stack, as observed through the other control signals routed to other inputs of the OR-gate 270.

Assume that DRAM0 is driving the data bus 210, the DRAM1 may observe a read request issued to other DRAMS (e.g., DRAM0) and decode a non-matching identification number associated with the read request to allow DRAM1 to disable access to the data bus 210 and only enable access to the data bus 210 when the snoop logic 282 of the DRAM 1 receives a proper signal. The snoop logic 282, which is monitoring the control signal 220 through a receiver 236 and an OR-gate 272, may snoop the control signal 220 to find out when the DRAM0 stops driving the data bus 210. The snoop logic 282 may detect the stopping time of the DRAM0 being driven by the data bus 210 by sensing a transition in the control signal 220. The snoop logic 282 may enable a driver 216 to drive the data bus 210 at an appropriate time, based on the transition in the control signal 220. While DRAM0 is driving the data bus 210, DRAM1 may receive a read request. The DRAM1 may decode a matching identification number associated with the read request; however, the read request may be delayed by the snoop logic 282 until the read request to DRAM0 is complete.

FIG. 3 is a diagram illustrating an example of a multi-dice stack 300 and associated resource sharing circuits, according to various embodiments. The multi-dice stack 300 may include a logic die 310 and four DRAMs 320, 330, 340 and 350. The logic die 310 may include an enumeration logic 312. In example embodiments, the enumeration logic 312 may include the configuration module 110 and the identification module 120, both of FIG. 1. FIG. 3 also shows a group of buses (e.g., TSVs) 370 (also called shared buses 370), which may include shared command, address, and data buses for DRAMs 320, 330, 340, and 350.

Also shown on FIG. 3 are control buses (e.g., TSVs) 360, 362, 364, and 366. The enumeration logic 312, including the configuration module 110 of FIG. 1, may configure each of DRAMs 320, 330, 340, and 350 by assigning a unique identifier to each DRAM. Enumeration logic 312 may use the configuration bus (e.g., TSV) 382 and identification bus (e.g., TSV) 384 to configure and identify the DRAMs 320, 330, 340, and 350 of the multi-dice stack 300. The DRAMs 320, 330, 340, and 350 may also include enumeration logics 322, 332, 342, and 352.

The process of configuration of DRAMs 320, 330, 340, 350 by the enumeration logic 312 starts from the configuration of the DRAM 320. The configuration process for each DRAM may include using a DRAM next to that DRAM (e.g., a DRAM under that DRAM) to enable the configuration. For example, the enumeration logic 322 may be enabled via an enable signal received from the enumeration logic 312. The enable signal may reach an enable input of the enumeration logic 322 through a via 324 connecting the output of the enumeration logic 312 to an enable input of the enumeration logic 322. Once enabled, the enumeration logic 322 may be able to read a unique identifier (e.g., an identification number such as 0) provided by the enumeration logic 312 from the configuration bus 382. The read unique identifier may then be loaded into the register 140 of FIG. 1, which exists on DRAM 320.

After the DRAM 320 is configured, the enumeration logic 322 may be stopped from reading the configuration bus 382. The enumeration logic 322 may then send a second enable signal through a via 334 to the enumeration logic 332 of DRAM 330 to enable reading of the configuration bus 382 by the enumeration logic 332. Similarly, the enumeration logics 342 and 352 may be successively enabled by the enumeration logics 332 and 342 through vias 344 and 354, respectively. Each of the DRAMS 330, 340 and 350 may also include the register 140 shown in FIG. 1, and use the register 140 to store the unique identifiers assigned to them by the enumeration logic 312. Each DRAM 320, 330, 340, and 350 may then be identified by the identification module 120 shown in FIG. 1 using an identification number placed on the identification bus 384 by the enumeration logic 312. In some embodiments the enumeration logic 312 may use an alternative method for enumerating the dies of the multi-dice stack 300.

Each DRAM, as discussed in more detail below, may include multiple logically-independent partitions (see partitions in DRAM of FIG. 6). An identification number assigned to each DRAM of the multi-dice stack 300, by the enumeration logic 312, may be distributed to the multiple logically-independent partitions of that DRAM. During the normal operation of the DRAM, when a command is issued within a particular partition, the identification number for the intended DRAM is transmitted along with the command. The partition that receives the command, if belongs to the DRAM that has the stored identification number matching the transmitted identification number may then respond to that command.

The DRAMs shown in the multi-dice stack 300 may also include the driver 224, the receiver 226, the OR-gate 270 and the snoop logic 280 as shown in both FIGS. 2 and 3. The driver 224 and the receiver 226 may be used to drive the control bus 360 or receive clock signals from the control bus 360 in a similar fashion as described above with respect to FIG. 2. To avoid data bus contention and for proper sequencing of commands, the snoop logic 280 may determine when ownership of any of the shared buses 370 is available for an individual DRAM of the multi-dice stack 300.

Figure 4:
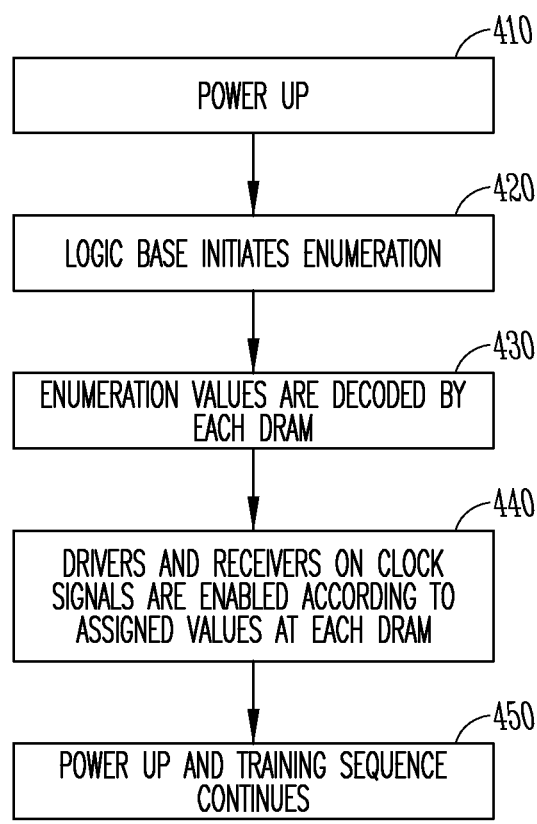
FIG. 4 is a block flow diagram illustrating a method for configuring the dice of a multi-dice stack, according to various embodiments of the invention.

FIG. 4 is a block flow diagram illustrating an example of a method 400 for configuring dice of a multi-dice stack, according to various embodiments. The multi-dice stack 300 of FIG. 3 is powered up or reset at operation 410. At operation 420, the logic die 310 of FIG. 3 may use the enumeration logic 312 shown in FIG. 3 to initiate the enumeration of the DRAMs of the multi-dice stack 300. At operation 430, unique identifier values are decoded by each DRAM using the decoder 260 of FIG. 2. At operation 440, drivers and receivers (for example, driver 224 and receiver 226, both of FIG. 3) connected to the control bus 360 of FIG. 3 may be enabled according to assigned unique identifiers to each DRAM (for example DRAM 320). At operation 450, configurations of the DRAMs in the multi-dice stack 300 continue. The configuration process restarts upon following power-ups or resets of the multi-dice stack 300.

Figure 5:
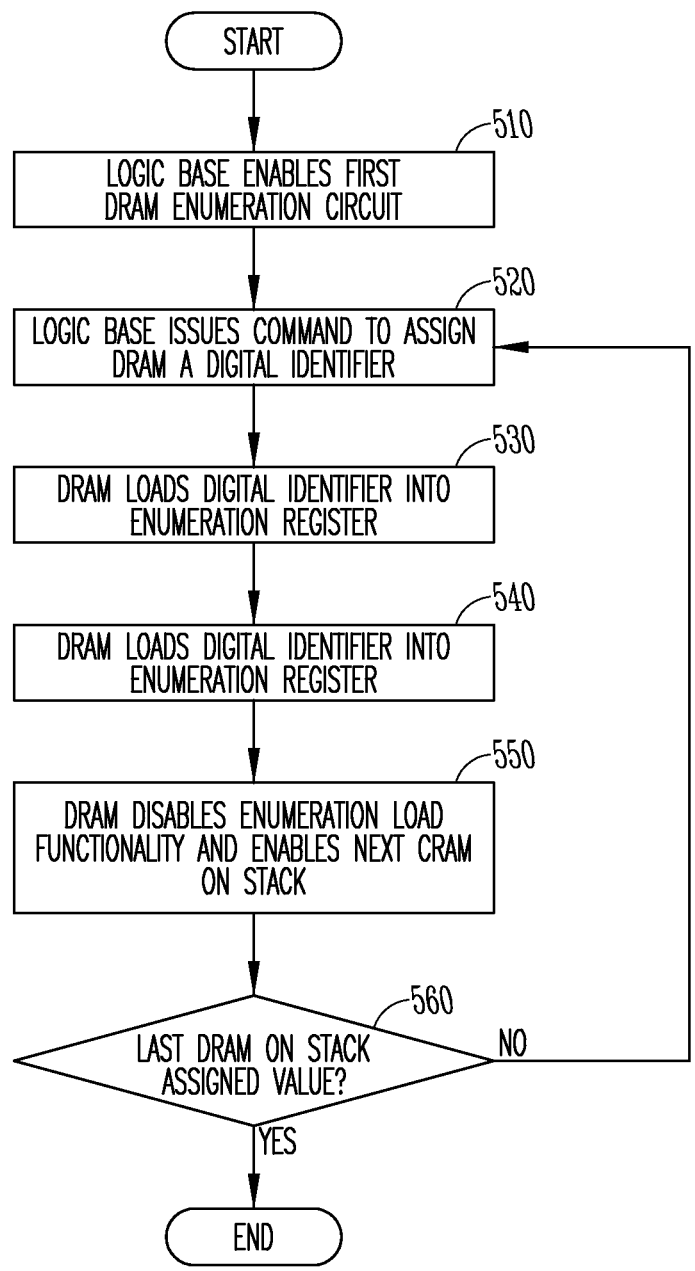
FIG. 5 is a block flow diagram illustrating a method for configuring the dice of a multi-dice stack, according to various embodiments of the invention.

FIG. 5 is a block flow diagram illustrating an example of a method 500 for configuring dice of a multi-dice stack, according to various embodiments. The method 500 starts at operation 510 when the logic die 310 of FIG. 3 starts configuration of the DRAM 320 by enabling the enumeration logic 322 of the DRAM 320. At operation 520, the enumeration logic 312 of the logic die 310 may issue a command to assign the DRAM 320 a unique identifier (e.g. a digital identifier or a digital identification number) using the configuration bus 382 of FIG. 3. At operation 530, the DRAM 320 may use the register 140 shown in FIG. 1 and included in the enumeration logic 322 to store the digital identifier assigned by the enumeration logic 312.

The DRAM 320 of FIG. 3, at operation 540, may disable the loading functionality of an identification number by the enumeration logic 322 shown in FIG. 3 and enable the enumeration logic 332 of the DRAM 330 of FIG. 3 for configuration of the DRAM 330. The enumeration logic 312 may perform similar operation with the other DRAMs in the multi-dice stack 300 (e.g., DRAMs 340 and 350). At the control operation 550, the enumeration logic 312 may check that all the DRAMs in the multi-dice stack 300, including the last DRAM 350, are configured with unique identifiers. If the last DRAM (e.g., DRAM 350) has been configured, the method 500 will end. Otherwise, the control is passed to the operation 520 where the remaining DRAMs will be configured with unique identifiers assigned to those DRAMs by the enumeration logic 312.

Figure 6:
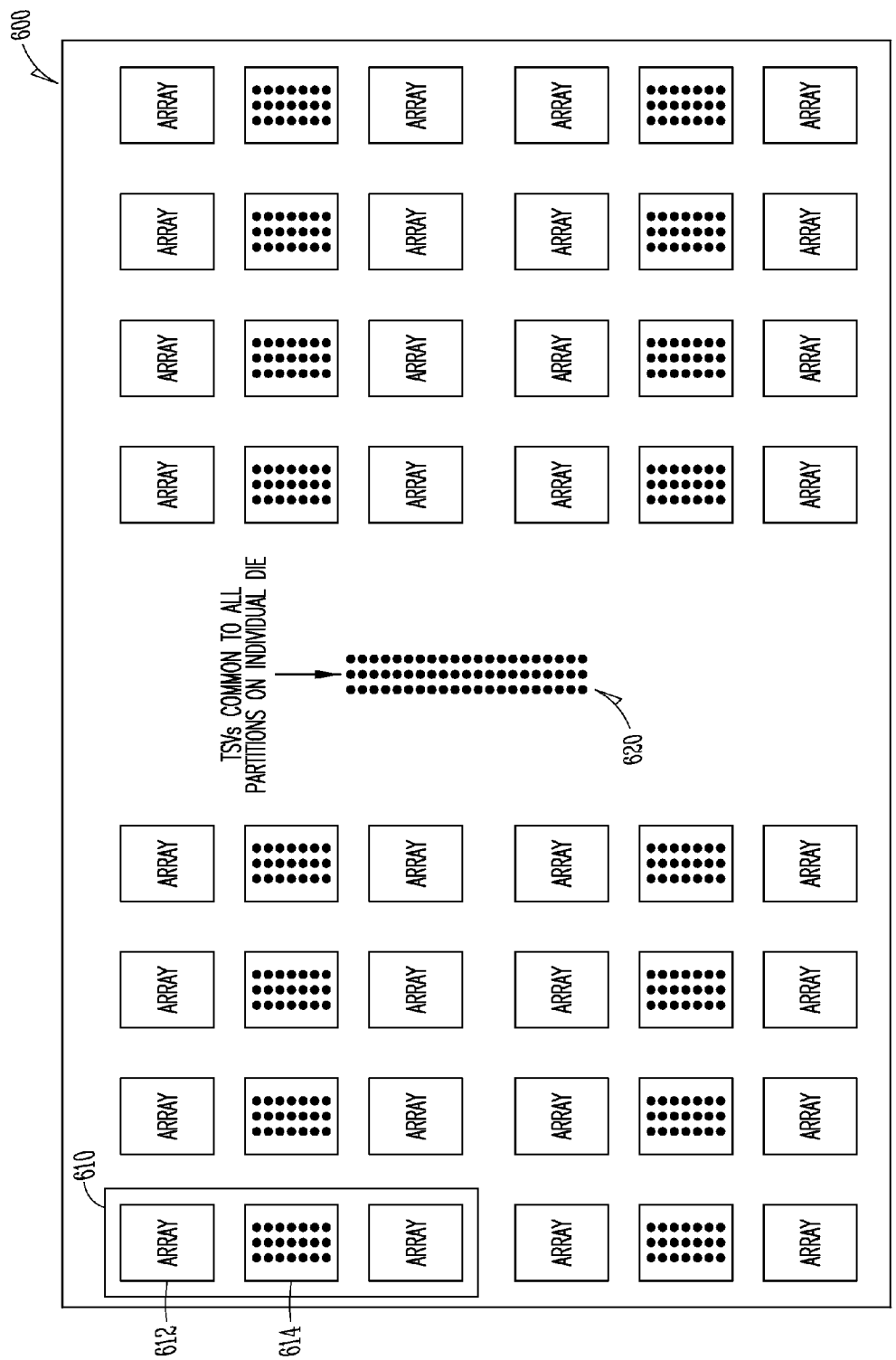
FIG. 6 is a diagram illustrating an example of a multi-partition memory die, according to various embodiments of the invention.

FIG. 6 is a diagram illustrating an example of a multi-partition memory die 600, according to various embodiments. The multi-partition memory die 600 may, for example, comprise one of the DRAMs of the multi-dice stack 300 of FIG. 3. As shown in the FIG. 6, the multi-partition memory die 600 may include a number of partitions 610 (for example, 16 partitions). Each partition may include several arrays 612 of memory cells. Each partition may also include a group of TSVs 614 dedicated to the partition. The group of TSVs 614 may include data, command and address buses dedicated to the partition 610. The multi-partition memory die 600 may also include an array of TSVs 620 which are common to all partitions of the multi-partition memory die 600. The configuration and identification of the multi-partition memory die 600 is performed in a similar fashion as described above with respect to the DRAMs of the multi-dice stack 300 of FIG. 3.

Figure 7:
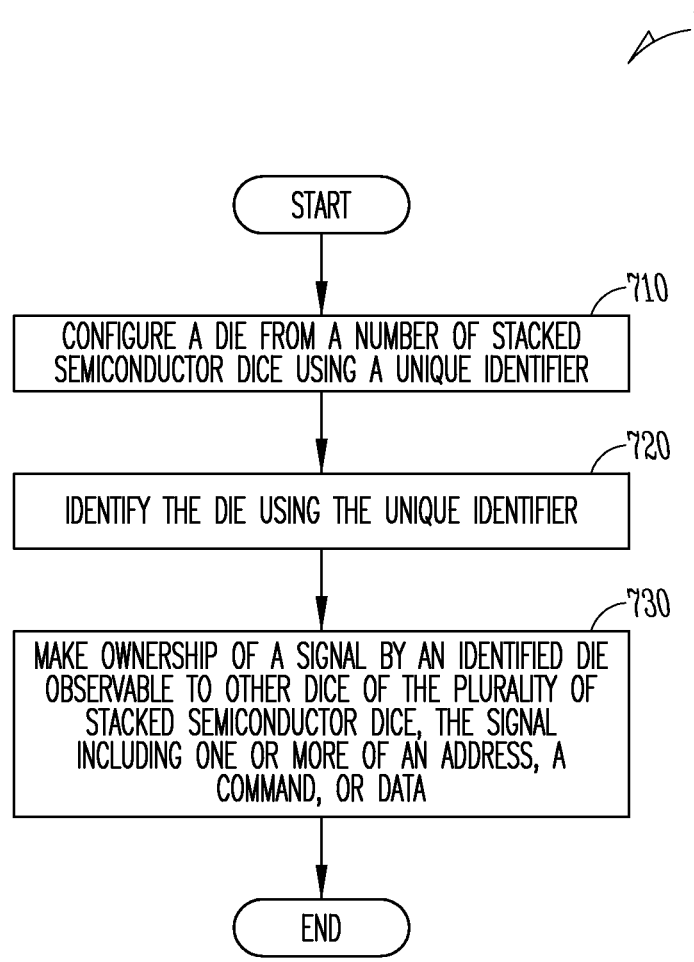
FIG. 7 is a flow diagram illustrating a method for sharing resources in a multi-dice stack, according to various embodiments of the invention.

FIG. 7 is a flow diagram illustrating an example of a method 700 for sharing resources in the multi-dice stack 300 of FIG. 3, according to various embodiments. The method 700 starts at operation 710, where the configuration module 110 of FIG. 1 may configure a die of a multi-dice stack 300 of FIG. 3 with a unique identifier. At operation 720, using the unique identifier, the enumeration logic 312 of FIG. 3 may use identification bus 384 to identify each DRAM of the multi-dice stack 300 of FIG. 3. At operation 730, the snoop module 130 of FIG. 1 may make ownership of a signal by an identified die (for example, die 320 of FIG. 3) observable to other dice of the multi-dice stack 300 (e.g., dice 330, 340 and 350). The signal may include one or more of an address, a command, or data communicated through one or more of the shared buses 370 of FIG. 3.

Figure 8:
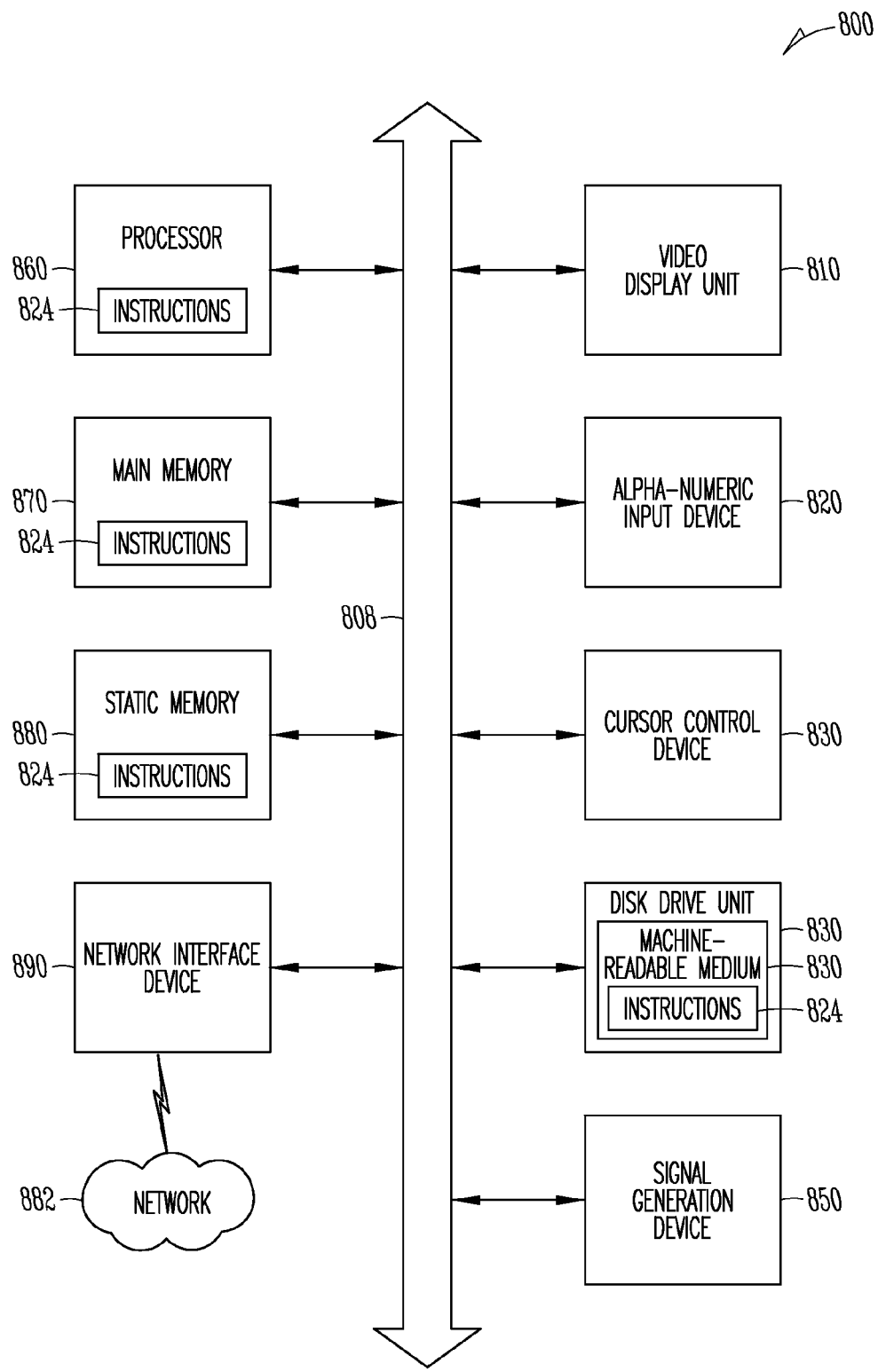
FIG. 8 is a diagram depicting an example representation of a machine, according to various embodiments for performing any one or more of the methodologies described herein.

FIG. 8 is a diagram illustrating an example representation of a machine 800, according to various embodiments. In an example embodiment, machine 800 includes a set of instructions that may be executed to cause machine 800 to perform any one or more of the methodologies discussed herein. In alternative embodiments, the machine 800 may operate as a standalone device or may be connected (e.g., networked) to other machines. In a networked deployment, the machine 800 may operate in the capacity of a server or a client machine in a server-client network environment or as a peer machine in a peer-to-peer (or distributed) network environment. Machine 800 may be realized in the form of a computer.

The machine 800 may be a server computer, a client computer, a personal computer (PC), a tablet PC, a set-top box (STB), a Personal Digital Assistant (PDA), a cellular telephone, a Web appliance, a network router, switch or bridge, or any machine capable of executing a set of instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein.

The example machine 800 may include a processor 860 (e.g., a central processing unit (CPU), a graphics processing unit (GPU) or both), a main memory 870 and a static memory 880, all of which communicate with each other via a bus 808. The machine 800 may further include a video display unit 810 (e.g., a liquid crystal display (LCD) or cathode ray tube (CRT)). The machine 800 also may include an alphanumeric input device 820 (e.g., a keyboard), a cursor control device 830 (e.g., a mouse), a disk drive unit 840, a signal generation device 850 (e.g., a speaker), and a network interface device 890.

The disk drive unit 840 may include a machine-readable medium 822 on which is stored one or more sets of instructions (e.g., software) 824 embodying any one or more of the methodologies or functions described herein. The instructions 824 may also reside, completely or at least partially, within the main memory 870 and/or within the processor 860 during execution thereof by the machine 800, with the main memory 870 and the processor 860 also constituting machine-readable media. The instructions 824 may further be transmitted or received over a network 882 via the network interface device 890.

While the machine-readable medium 822 is shown in an example embodiment to be a single medium, the term "machine-readable medium" should be taken to include a single medium or multiple media (e.g., a centralized or distributed database, and/or associated caches and servers) that store the one or more sets of instructions. The term "machine-readable medium" shall also be taken to include any medium capable of storing, encoding, or carrying a set of instructions for execution by the machine and that cause the machine to perform any one or more of the methodologies of the present technology. The term "machine-readable medium" shall accordingly be taken to include, but not be limited to, solid-state memories and optical and magnetic media.

Embodiments of a method and a circuit for sharing resources in a stacked dice have been described. Although the present embodiments have been described, it will be evident that various modifications and changes may be made to these embodiments. Accordingly, the specification and drawings are to be regarded in an illustrative rather than a restrictive sense.

The Abstract of the Disclosure is provided to comply with 37 C.F.R. §1.72(b), requiring an abstract that allows the reader to quickly ascertain the nature of the technical disclosure. It is submitted with the understanding that it will not be used to interpret or limit the claims. In addition, in the foregoing Detailed Description, it may be seen that various features are grouped together in a single embodiment for the purpose of streamlining the disclosure. This method of disclosure is not to be interpreted as limiting the claims. Thus, the following claims are hereby incorporated into the Detailed Description, with each claim standing on its own as a separate embodiment.

What is claimed is:

1. A method comprising:
configuring a die of a plurality of stacked semiconductor dice with a unique identifier;
identifying the die using the unique identifier; and
making ownership of a first action request by the identified die observable to other dice of the plurality of stacked semiconductor dice, the first action request including at least one of a control or timing signal, wherein each die of the plurality of stacked semiconductor dice includes snoop logic to monitor and determine when the identified die stops driving a resource shared by the plurality of stacked semiconductor dice, wherein one die of the other dice is configured, while the identified die is driving the resource, to observe the first action request issued to the identified die, to decode a non-matching identification number that is associated with the first action request and does not match the one die of the other dice to disable access by the one die of the other dice to the resource, to receive a second action request, and to decode a matching identification number associated with the second action request, and wherein the second action request associated with the one die of the other dice is delayed by the snoop logic of the die of the other dice until the first action request issued to the identified die is complete.

2. The method of claim 1, further including sharing a bus by the plurality of stacked semiconductor dice, the bus including at least one of a control bus, an address bus, or a data bus.

3. The method of claim 2, wherein identifying the die includes identifying the die using an identification number when placing a signal destined for the die on the bus.

4. The method of claim 1, wherein configuring the die includes storing the unique identifier in the die.

5. The method of claim 1, wherein configuring the die with the unique identifier includes using a first die next to the die to enable the configuration.

6. The method of claim 1, wherein configuring the die occurs when the stacked semiconductor dice are either powered up or reset.

7. The method of claim 1, wherein identifying the die includes applying an identification number to inputs at an input/output (I/O) interface of the die.

8. The method of claim 1, wherein identifying the die includes routing an identification number through a decoder, the decoder generating a set of select signals, the set of select signals causing a selection of the die.

9. An apparatus comprising:
a plurality of stacked semiconductor dice;
a configuration module to configure a die of the plurality of stacked semiconductor dice with a unique identifier;

an identification module to identify the die using the unique identifier; and a snoop module to make ownership of a first action request by an identified die observable to other dice of the plurality of stacked semiconductor dice, the first action request including at least one of a control or timing signal, wherein each die of the plurality of stacked semiconductor dice includes snoop logic within the snoop module to monitor and determine when the identified die stops driving a resource shared by the plurality of stacked semiconductor dice, wherein one die of the other dice is configured, while the identified die is driving the resource, to observe the first action request issued to the identified die, to decode a non-matching identification number that is associated with the first action request and does not match the one die of the other dice to disable access by the one die of the other dice to the resource, to receive a second action request, and to decode a matching identification number associated with the second action request, and wherein the second action request associated with the one die of the other dice is delayed by the snoop logic of the die of the other dice until the first action request issued to the identified die is complete.

10. The apparatus of claim 9, including a bus shared by the plurality of stacked semiconductor dice, the bus including at least one of a control bus, an address bus, or a data bus.

11. The apparatus of claim 10, wherein the die includes a driver to transmit signals to the bus when the die is identified as an owner of the bus.

12. The apparatus of claim 10, wherein the die includes a receiver to receive signals from the bus, the receiver being enabled when another die is driving the bus.

13. The apparatus of claim 9, further including a register to store the unique identifier in the die.

14. The apparatus of claim 9, wherein the configuration module is arranged to configure the die when the stack is either powered up or reset.

15. The apparatus of claim 9, wherein the identification module includes an interface to identify the die by applying an identification number to inputs at an input/output (I/O) interface of the die.

16. The apparatus of claim 9, wherein the identification module includes a decoder to decode a received identification number to generate a set of select signals, the set of select signals causing a selection of the die.

17. The apparatus of claim 16, wherein the identification module is arranged to compare the received identification number with a stored unique identifier to identify the die.

18. The apparatus of claim 9, wherein the die is a memory chip including a dynamic random access memory (DRAM).

19. The apparatus of claim 18, wherein the DRAM includes a plurality of partitions and the plurality of partitions share the unique identifier.

20. A stack comprising:
means for configuring a die of a plurality of stacked semiconductor dice with a unique identifier;
means for identifying the die using the unique identifier; and
means for making an ownership of a first action request by an identified die observable to other dice of the plurality of stacked semiconductor dice, the first action request including at least one of a control or timing signal, wherein each die of the plurality of stacked semiconductor dice includes a snoop logic to monitor and determine when the identified die stops driving a resource shared by the plurality of stacked semiconductor dice, wherein one die of the other dice is configured, while the identified die is driving the resource, to observe the first action request issued to the identified die, to decode a non-matching identification number that is associated with the first action request and does not match the one die of the other dice to disable access by the one die of the other dice to the resource, to receive a second action request, and to decode a matching identification number associated with the second action request, and wherein the second action request associated with the one die of the other dice is delayed by the snoop logic of the die of the other dice until the first action request issued to the identified die is complete.

21. The stack of claim 20, wherein the means for identifying the die includes means for decoding a received identification number to generate a set of select signals, the set of select signals causing a selection of the die.

* * * * *